(12) United States Patent
Kato et al.

(10) Patent No.: US 7,959,821 B2
(45) Date of Patent: Jun. 14, 2011

(54) ELECTROMAGNETISM SUPPRESSING MATERIAL, ELECTROMAGNETISM SUPPRESSING DEVICE, AND ELECTRONIC APPLIANCE

(75) Inventors: Yoshihiro Kato, Tokyo (JP); Yoshinori Ito, Tokyo (JP); Katsumi Okayama, Kanagawa (JP); Kaoru Kobayashi, Chiba (JP); Masaki Orihashi, Tokyo (JP); Makoto Suzuki, Miyagi (JP); Takashi Miyazaki, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/980,450

(22) Filed: Oct. 31, 2007

(65) Prior Publication Data

US 2008/0067467 A1 Mar. 20, 2008

Related U.S. Application Data

(62) Division of application No. 11/185,879, filed on Jul. 21, 2005.

(30) Foreign Application Priority Data

Aug. 2, 2004 (JP) ................................. 2004-225835
May 9, 2005 (JP) ................................. 2005-136560

(51) Int. Cl.
*H01B 3/00* (2006.01)
*H01Q 17/00* (2006.01)

(52) U.S. Cl. ........... 252/62.51 R; 252/62.54; 252/62.53; 252/62.62; 252/62.6; 523/137; 361/818

(58) Field of Classification Search .................. 523/137; 252/62.51 R, 62.51 C, 62.52–62.64; 361/818
See application file for complete search history.

(56) References Cited

U.S. PATENT DOCUMENTS

| 2,250,212 | A | | 7/1941 | Suits | |
|---|---|---|---|---|---|
| 2,834,926 | A | | 5/1958 | Booe | |
| 3,040,164 | A | * | 6/1962 | Pevar | 219/83 |
| 3,556,858 | A | | 1/1971 | Hill et al. | |
| 3,814,630 | A | | 6/1974 | Bjorkman | |
| 3,832,457 | A | * | 8/1974 | Sugimoto et al. | 424/9.411 |
| 4,026,713 | A | * | 5/1977 | Sambucetti et al. | 252/62.56 |
| 4,094,804 | A | * | 6/1978 | Shimoiizaka | 252/62.52 |
| 4,234,437 | A | * | 11/1980 | Friberg et al. | 252/62.51 R |
| 4,241,176 | A | * | 12/1980 | Avrameas et al. | 435/7.92 |
| 5,084,502 | A | * | 1/1992 | Buscall et al. | 524/457 |
| 5,298,179 | A | * | 3/1994 | Ukita et al. | 252/62.54 |
| 5,329,932 | A | * | 7/1994 | Yount | 600/534 |
| 5,382,373 | A | * | 1/1995 | Carlson et al. | 252/62.55 |
| 5,543,219 | A | * | 8/1996 | Elwakil | 428/402.24 |
| 5,688,392 | A | * | 11/1997 | White | 205/654 |
| 2002/0128348 | A1 | * | 9/2002 | Palmer | 523/160 |
| 2004/0136905 | A1 | * | 7/2004 | Kent et al. | 424/1.11 |
| 2008/0067467 | A1 | * | 3/2008 | Kato et al. | 252/62.54 |

FOREIGN PATENT DOCUMENTS

| EP | 0 095 692 | | 12/1983 |
|---|---|---|---|
| EP | 0 588 238 | | 3/1994 |
| JP | 64-052302 | * | 2/1989 |
| JP | 64-52302 | * | 2/1989 |
| JP | 64-68999 | | 3/1989 |
| JP | 07-097238 | | 4/1989 |
| JP | 03-267436 | A | 11/1991 |
| JP | 05-21982 | | 1/1993 |
| JP | 08-186395 | | 7/1996 |
| JP | 09-205011 | A | 8/1997 |
| JP | 2000-261181 | A | 9/2000 |
| JP | 2004-253640 | A | 9/2004 |
| KR | 2001-0010433 | | 2/2001 |
| WO | WO-00/36044 | A1 | 6/2000 |
| WO | WO-02/46285 | | 6/2002 |

OTHER PUBLICATIONS

Translation for JP 64-52302.*
Extended European Search Report for corresponding European Application No. 05 29 1635.
English Translation of Japanese Office Action issued Jun. 29, 2010 for corresponding Japanese Application No. 2005-136560.
English Language translation of the Japanese Office Action issued Jun. 29, 2010 for corresponding Japanese Application No. 2005-136560.

* cited by examiner

Primary Examiner — C. Melissa Koslow
(74) Attorney, Agent, or Firm — Rader, Fishman & Grauer PLLC

(57) ABSTRACT

An electromagnetism suppressing material has an increased electromagnetism suppressing effect, can be flexibly formed in various shapes, and is inexpensive. An electromagnetism suppressing device uses the electromagnetism suppressing material, and an electronic appliance uses the electromagnetism suppressing material or the electromagnetism suppressing device. The electromagnetism suppressing material is a liquid material and/or gel material with electrical polarity.

20 Claims, 11 Drawing Sheets

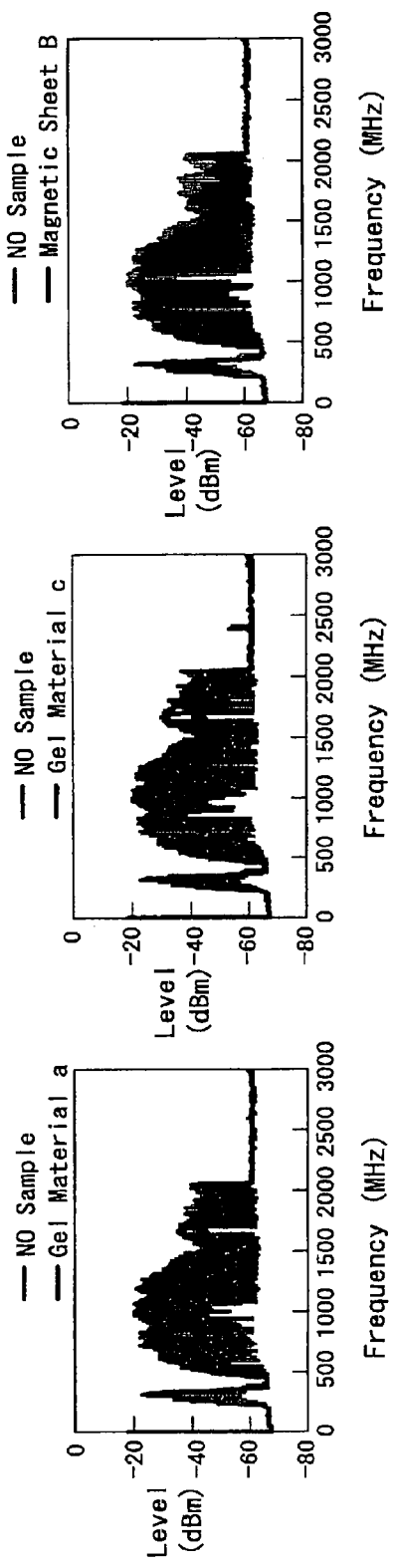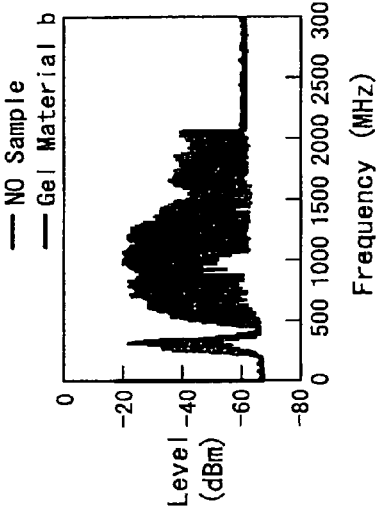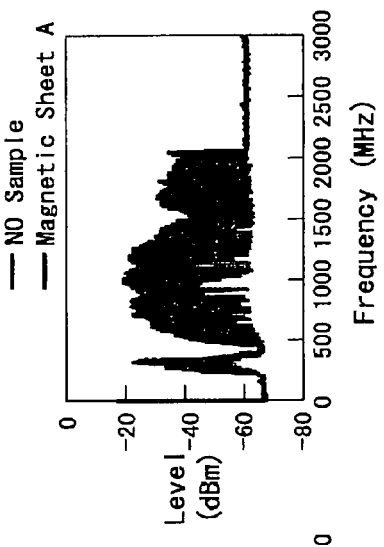

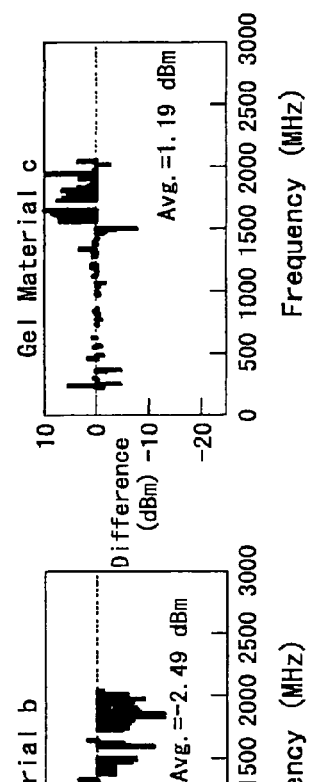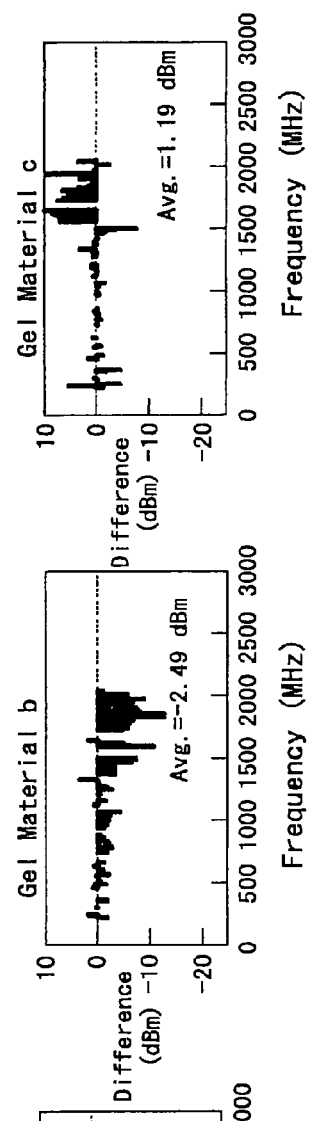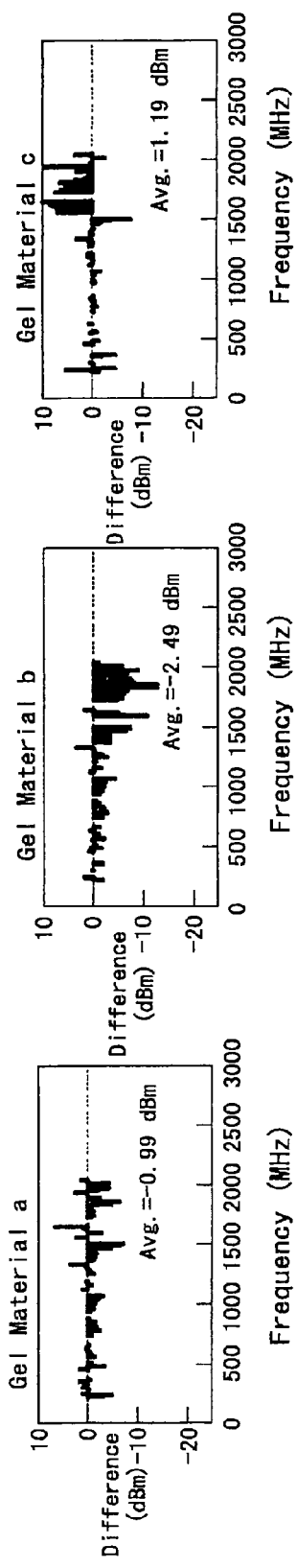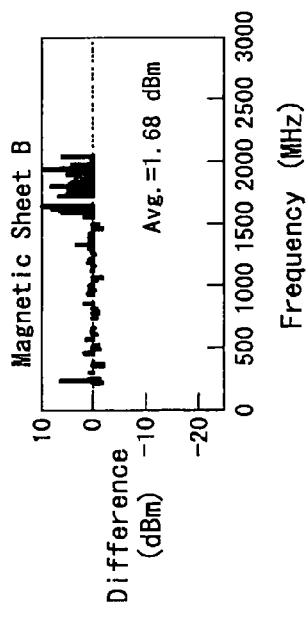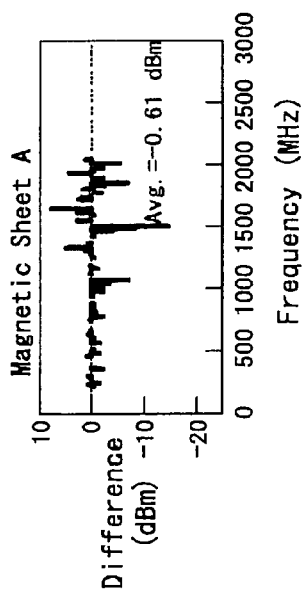

ELECTROMAGNETISM SUPPRESSING MATERIAL, ELECTROMAGNETISM SUPPRESSING DEVICE, AND ELECTRONIC APPLIANCE

CROSS REFERENCES TO RELATED APPLICATIONS

The present application is a Divisional Application of U.S. patent application Ser. No. 11/185,879, filed Jul. 21, 2005, which claims priority from Japanese Patent Application JP 2004-225835 filed in the Japanese Patent Office on Aug. 2, 2004, and Japanese Patent Application JP2005-136560 filed in the Japanese Patent Office on May 9, 2005, the entire contents of which are incorporated herein by reference.

BACKGROUND OF THE INVENTION

1. Field of the Invention:

The present invention relates to an electromagnetism suppressing material used to block unnecessary radiation produced by an electronic appliance, an electromagnetism suppressing device that uses the electromagnetism suppressing material, and an electronic appliance that is constructed using the electromagnetism suppressing material or the electromagnetism suppressing device.

2. Description of the Related Art:

Increasing use of high-frequency electromagnetic waves in recent years has been accompanied by a new environmental problem of electromagnetic noise causing damage such as the malfunctioning of appliances and adverse effects on the brain and body. As one example, wide use is made of the frequency band 2.45 GHz where wireless communication can be carried out without a license, such as by wireless LANs (IEEE 802.11b Standard), Bluetooth, and ISM (Industrial, Scientific and Medical) appliances. As information appliances are converted to digital processing or use higher clock frequencies, harmonics may occur on this band. Since the number and applicability of both potential sources of electromagnetism and interfered-with devices are increasing exponentially, the risk of interference occurring is increasing astronomically. To counter the problem of electromagnetic interference (EMI), individual appliances need to be prevented from radiating unnecessary electromagnetic waves that can interfere with the normal operation of other appliances (suppression of emission) and also to have sufficient immunity so as to remain unaffected by electromagnetic waves that penetrate from outside (improved immunity). This is referred to as "electromagnetic compatibility" (EMC), and a number of standards for establishing whether electronic appliances exhibit EMC in electromagnetic environments have been determined.

For example, when implementing EMC measures during circuit design, the principle method is to use interference suppression elements as circuit elements for reducing the interfering electromagnetic waves generated from an electronic appliance and to prevent electromagnetic interference from penetrating the electronic appliance. A variety of interference suppression elements exist, such as an LC filter that is a combination of a capacitor and a coil, a varistor or the like. Such elements are designed so that there is little loss when a desired signal passes through the element but a large reflection loss and transmission loss for interference, and they are combined according to an appropriate method and used in most electronic circuits. However, there are cases where the voltage and the current waveform fluctuate due to a particular resonant frequency that depends on how the circuit elements are combined, with this resulting in a large distortion in the desired signal waveform. In addition, the wavelengths of electromagnetic waves in a GHz band are close to the circuit length of an electronic circuit, so that there is the risk of malfunctioning due to the circuit itself acting as an antenna for the electromagnetic waves.

Such EMC problems that cannot be overcome by circuit design have been addressed by a mounting design. As one solution, attention has been focused in recent years on using electromagnetism suppressing members or electromagnetism absorbing members where magnetic powder is mixed with resin and used to form sheets. Such magnetic sheets are mainly used in two ways. In the first, magnetic waves radiated from an antenna are absorbed, while in the second, a sheet is used as a harmonic filter that prevents harmonic noise components from being added at an antenna.

According to the principle of electromagnetic wave absorption, most of the incident electromagnetic energy is converted to heat energy inside an electromagnetism suppressing member or electromagnetism absorbing member. This means that an electromagnetism absorbing member can reduce both the energy reflected at the front surface and the energy transmitted to the rear. The mechanisms for conversion to heat energy are classified as "conductive loss", "dielectric loss" and "magnetic loss", with the electromagnetic absorbed energy P per unit volume (W/m³) being expressed in Equation 1 using the electric field E, the magnetic field H, and the frequency f. The first term represents the conductive loss, the second term represents the dielectric loss, and the third term represents the magnetic loss.

$$P = \frac{1}{2}\sigma|E|^2 + \pi f \varepsilon''|E|^2 + \pi f \mu''|H|^2 \qquad <\text{Equation 1}>$$

Conductivity: σ
Complex dielectric constant: ∈=∈'-j∈"
Complex magnetic induction rate: μ=μ'-jμ"

In Equation 1, the first term expresses the conductive loss, the second term expresses the dielectric loss, and the third term expresses the magnetic loss.

Also, in addition to the electromagnetism absorbing effect described above, an electromagnetism suppressing member or an electromagnetism absorbing member used on a transmission path is thought to have a filter effect due to the inductor component that is particular to the magnetic material.

At present, magnetic sheets that are used as an electromagnetism suppressing member or an electromagnetism absorbing member are stuck onto printed circuit boards, flexible printed circuits (FPCs), the rear surface of a case, the upper surface of a package, and the like. However, due to the complex signal transmission paths inside electronic appliances and the differences in electric and magnetic field distributions produced by such, it is presently difficult to clearly establish the principles and effects of such electromagnetism suppressing members and electromagnetism absorbing members. Also, since the characteristics and effects of magnetic sheets are not clearly understood, functional evaluations of magnetic sheets are often carried out by estimating using the harmonic filter effect (suppressing effect) mainly on a microstrip line and the magnitudes of the losses (∈", μ").

An electromagnetism absorbing material where minute particles of ferromagnetic material are uniformly dispersed in a medium such as water, glycerine, or methyl alcohol as a medium with a high dielectric constant has been disclosed (see Patent Document 1).

<Patent Document 1>

Japanese Laid-Open Patent Publication No. 64-52302

However, when a magnetic sheet is stuck onto a printed circuit board, and in particular onto an IC package, or onto the rear surface of a housing to block unnecessary radiation in an electronic appliance as described above, it is often not possible to achieve the expected electromagnetism absorbing effect, and conversely a phenomenon where the magnetic field strength actually increases may be observed. To remedy this situation, an electromagnetism absorbing sheet with better absorption characteristics than existing magnetic sheets is required. With existing sheets, if the included amount of magnetic powder is increased to strengthen such characteristics, the specific gravity of the magnetic sheet will rise together with the amount of magnetic powder, resulting in the magnetic sheet becoming hard. When attached to a flexible printed circuit (FPC), an electromagnetism absorbing sheet needs to be more flexible so that the flexibility of the FPC can be utilized. In addition, the use of magnetic powder results in high costs, and a less expensive electromagnetism absorbing sheet is required.

SUMMARY OF THE INVENTION

In view of the above problem, the present invention was conceived to provide a low-cost electromagnetism suppressing material that has an increased electromagnetism suppressing effect and can be flexibly formed in various shapes, an electromagnetism suppressing device that uses the electromagnetism suppressing material, and an electronic appliance that uses the electromagnetism suppressing material or the electromagnetism suppressing device.

An electromagnetism suppressing material according to the present invention is a liquid material and/or gel material with electrical polarity.

Another electromagnetism suppressing material according to the present invention is a molecular liquid material or an electrolyte material with electrical polarity.

Yet another electromagnetism suppressing material according to the present invention may be composed by mixing a low-molecular-weight and/or polymeric material with electrical polarity and a molecular liquid material or an electrolyte with electrical polarity.

Yet another electromagnetism suppressing material according to the present invention is a liquid electrolyte material or a gel material including a liquid electrolyte material.

An electromagnetism suppressing device according to the present invention is composed by sealing an electromagnetism suppressing material described above in a sealed member.

An electronic appliance according to the present invention uses an electromagnetism suppressing material described above or the electromagnetism suppressing device described above.

According to the electromagnetism suppressing material of the present invention, a liquid material or a gel material that has electrical polarity, such as an electrolyte or a molecular liquid material that has electrical polarity, is highly efficient at absorbing and suppressing electromagnetism, and it can be cheaply formed as EMC compatible components that are flexible. By doing so, it is possible not only to greatly reduce the cost of measures against unnecessary radiation, but also to reduce the time taken by such measures through high efficiency. In addition, by mixing in magnetic powder, such material can be designed with even higher efficiency. Also, the electromagnetism suppressing material is flexible compared to existing magnetic materials, so that the mounting surface can be simplified and a wide range of uses can be realized.

According to the electromagnetism suppressing device of the present invention, the electromagnetism suppressing material described above that is very efficient at absorbing electromagnetism is sealed in a sealed member, such as a resin sheet, so that an electromagnetism suppressing device that can absorb and suppress electromagnetism with high efficiency can be obtained and an EMC-compliant component that is flexible can be formed at low cost.

According to the electronic appliance of the present invention, by using the electromagnetism suppressing material or the electromagnetism suppressing device composed by sealing the electromagnetism suppressing material in a sealed member, it is possible to suppress or absorb unnecessary radiation and malfunctioning of the electromagnetism suppressing material can be prevented.

BRIEF DESCRIPTION OF THE DRAWINGS

FIGS. 1A to 1C are graphs showing levels for different frequencies when electromagnetism suppressing materials according to a first embodiment of the present invention are used, while FIGS. 1D to 1E are graphs showing levels for different frequencies when conventional magnetic sheets are used;

FIGS. 2A to 2E are graphs showing differences in electromagnetism between the respective materials in FIGS. 1A to 1E and when no sample is used;

DESCRIPTION OF THE PREFERRED EMBODIMENTS

Preferred embodiments of the present invention will now be described with reference to the attached drawings.

Magnetic materials are still being used as the most common electromagnetism suppressing materials for a high frequency band. That is, to suppress and absorb electromagnetism, a magnetic sheet that uses a magnetic material is designed so that the third term in Equation 1 given above, that is, magnetic permeability μ" indicating magnetic loss, is high.

However, the present inventors focused on materials where the second item in Equation 1 given above, that is, the dielectric constant ∈" that indicates the inductive loss, is high for frequencies in the MHz band and GHz band. A solid ferromagnetic material such as the well-known barium titanate exhibits a high dielectric constant in keeping with its name, but since the resonance phenomena occur at low frequencies, hardly any dispersion characteristics are exhibited for the dielectric constant at frequencies in the MHz band and the GHz band and the dielectric constant ∈" is low. For this reason, magnetic materials thus far have been the mainstream electromagnetism suppressing materials for high frequency bands.

On the other hand, the present inventors focused on the dielectric constant of liquid materials with electrical polarity, that is, liquid materials composed of polarized molecules or liquid materials including ions, such as an electrolyte. By doing so, the inventors invented an electromagnetism suppressing material with the large electromagnetism absorbing effect described above. In addition, by using a chemically crosslinked gel, a stabilized state can be maintained even when the temperature of an apparatus changes, thereby increasing reliability.

In a molecular liquid with potential polarity, in many cases, relaxation due to orientational polarization occurs at a frequency of several tens of GHz to several thousand GHz. In general, the relaxation time is longer for liquids with higher molecular weights and stronger interaction between molecules (that is, high viscosity), with dispersion appearing at low frequencies. For example, the dielectric relaxation characteristic occurs at around 25 GHz for water ($H_2O$), at 3 Ghz for methanol ($CH_3OH$) and at 1 GHz for ethanol ($C_2H_5OH$). Dielectric dispersion occurs in the same way for an electrolyte that includes ions.

Figure 7:
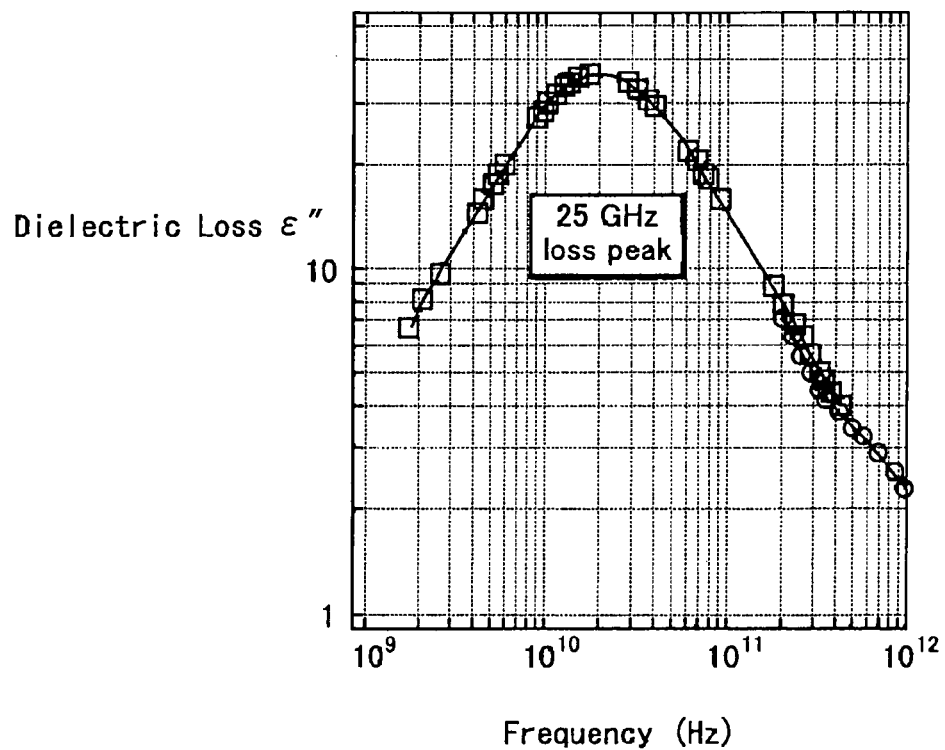
FIG. 7 is a graph showing the dielectric loss of water for different frequencies.

Water is used as a representative example of a liquid for the frequency dispersion of the dielectric constant. The frequency dispersion characteristics of the dielectric constant of water are shown in FIG. 7. From FIG. 7, it can be understood that the relaxation phenomenon of water occurs at around 25 Ghz. Also, the peak value of the loss $\in r"$ of the relative dielectric constant is a fairly high value of around 40. By comparing this to the loss μr" in the relative dielectric constant of a magnetic sheet that is 10 or below, it can be understood that the electromagnetic absorption of water is higher than that of the magnetic sheet.

In addition, for a material, such as an aqueous protein solution, where a polymeric material is combined with a liquid material, a plurality of dielectric dispersions occur due to interaction of the respective relaxation phenomena. For example, if the complex dielectric constant of an aqueous protein solution with a molecular weight of several tens of thousands is measured across a range of 500 kHz to 10 GHz, three dispersions are observed. The dispersion at the lowest frequency is present at several hundred kHz to several MHz, and it corresponds to the motion of the entire protein, or a domain. The dispersion at several hundred MHz corresponds to the motion of the bonded water that is bound to the protein that moves slowly. The dispersion whose base is observed at several GHz or above is caused by the motion of the free water present in the solution. In an electrolyte that includes ions, dispersion due to ion conduction is observed in addition to the above.

In this way, by using only a molecular liquid with potential polarity or only an electrolyte, a favorable electromagnetism suppressing material can be obtained. By mixing a polymeric material into such a solution, the dielectric relaxation dispersion of the solution near the polymer is affected by the polymer, so that the dielectric relaxation dispersion in the initial frequency band can also be shifted.

For this reason, the electromagnetism suppressing material according to the present invention focuses on a material with a high dielectric constant ∈" from Equation 1 described above, and therefore it can suppress and absorb electromagnetism of frequencies in the MHz band and the GHz band. The present inventors tested the electromagnetism suppressing effect of representative electromagnetism suppressing materials of the present embodiment where the focus is on the dielectric constant. The results of such tests are described later.

An electromagnetism suppressing material that is a first embodiment of the present invention is composed of a liquid material and/or gel material that has electrical polarity. That is, the material is composed of the above-described liquid material, or a gel material, or a material composed of the above-described liquid material and a gel material. As the liquid material, it is possible to use a molecular liquid material with electrical polarity, or an electrolyte including ions.

As the gel material, it is possible to use a material produced by causing a low-molecular-weight and/or polymeric material with electrical polarity to swell with the above-described molecular liquid material with electrical polarity, or a material produced by causing a low-molecular-weight and/or polymeric material with electrical polarity to swell with the above-described electrolyte material.

An electromagnetism suppressing material according to another embodiment of the present invention is composed of a material produced by mixing the above low-molecular-weight and/or polymeric material with electrical polarity with the molecular liquid material with the above-described polymeric liquid material with electrical polarity. Alternatively, the electromagnetism suppressing material is composed of a material produced by mixing the above-described low-molecular-weight and/or polymeric material with electrical polarity described above and the above-described electrolyte material. In this case, the electromagnetism suppressing material includes a gel and a mixture of a gel and a liquid.

An electromagnetism suppressing material according to yet another embodiment of the present invention is composed of a material produced by mixing a low-molecular-weight and/or polymeric material that can absorb and retain moisture and the above-described molecular liquid material with the electrical polarity. Alternatively, the electromagnetism suppressing material is composed of a material produced by mixing a low-molecular-weight and/or polymeric material that can absorb and retain moisture and the above-described electrolyte material. In this case, the electromagnetism suppressing material includes a gel and a mixture of a gel and a liquid.

Electromagnetism suppressing materials according to other embodiments of the present invention are composed by further mixing magnetic powder into the electromagnetism suppressing materials according to the embodiments described above.

Representative examples of the above-described molecular liquid material with electrical polarity are water, ethanol, and methanol.

Representative examples of the ion electrolyte described above may include an aqueous solution of a compound of a group 1A element and a halogen element. Other representative examples of the ion electrolyte described above may include an aqueous solution of a compound of a group 2A element and a halogen element. The ion electrolyte described above can be selected from aqueous sodium chloride solution, aqueous sodium iodide solution, aqueous potassium chloride solution and aqueous potassium iodide solution, aqueous calcium chloride solution and aqueous magnesium chloride solution, aqueous sodium hydroxide solution, aqueous hydrochloric acid solution, aqueous ammonium chloride solution, and aqueous zinc chloride solution.

The group 1A elements referred to here are lithium: Li, sodium: Na, potassium: K, rubidium: Rb, cesium: Cs, and francium: Fr.

The group 2A elements referred to here are beryllium: Be, magnesium: Mg, calcium: Ca, strontium: Sr, barium: Ba, and radium: Ra.

The halogen elements referred to here are fluorine: F, chlorine: Cl, bromine: Br, iodine: I, and astatine: At.

Representative examples of the magnetic powder described above are Mn—Zn ferrite, Cu—Zn ferrite, and Ni—Zn ferrite.

The low-molecular-weight material and the polymeric material described above are classified so that materials with a molecular weight of around 10,000 or above are "polymeric materials" and materials with a molecular weight below this weight are "low-molecular-weight materials". Representative examples of polymeric materials are acrylamides.

Polyacrylamides and ethylene glycols can be used as representative examples of the above-described low-molecular-weight and/or polymeric material that has electrical polarity.

Polyethylenes and polyacrylamides can be used as representative examples of the above-described low-molecular-weight and/or polymeric material that can absorb and retain moisture.

In the present embodiment, an electromagnetism suppressing device can be constructed by sealing one or two or more of the electromagnetism suppressing materials described above in a required sealed member. The sealed member will be described later.

In addition, in the present embodiment, an electronic appliance can be constructed by mounting the electromagnetism suppressing material and/or electromagnetism suppressing device described above.

Next, the test results for the electromagnetism suppressing effect of a representative electromagnetism suppressing material according to the present embodiment will be described. Here, samples of the electromagnetism suppressing material according to the present embodiment will be described while being compared to a conventionally available magnetic sheet.

As the electromagnetism suppressing material according to the present embodiment that was used for measuring the effect, three types of gel material a, b, and c were fabricated by preparing two types of water solutions by water and salt with respect to two types of acrylamide gel.

The gel material a of the present embodiment is a gel material with a 39.9 degree of swelling produced by swelling a first type of acrylamide gel with a salt solution including 2 mol/L of sodium chloride that is an electrolyte material.

Next, the gel material b of the present embodiment is a gel material with a 27.8 degree of swelling produced by swelling a second type of acrylamide gel with a salt solution including 2 mol/L of sodium chloride that is an electrolyte material.

Next, the gel material c of the present embodiment is a gel material with a 42.3 degree of swelling produced by swelling the first type of acrylamide gel with water.

In addition, in the present experiment, two types of conventionally sold magnetic sheets were used. The electromagnetism suppressing sheet A (hereinafter simply "magnetic sheet A") is a sheet that is 0.5 mm thick and suppresses and absorbs electromagnetism of the MHz band. The electromagnetism suppressing sheet B (hereinafter simply "magnetic sheet B") is a sheet that is 0.5 mm thick and suppresses and absorbs electromagnetism of the GHz band.

The respective gel materials a, b, and c of the present embodiment were used after being sealed (packaged) in a sealed member made of resin.

The degree of swelling is (weight when swollen)/(mass when dry), and it is a value that expresses how many grams of water can be held per 1 g of polymer.

It should be noted that the gel materials a, b, and c of the present embodiment are merely used for the present experiments, and the present invention is not limited to these materials. By selecting and designing a material by focusing on the dielectric constant, it is possible to increase the suppressing efficiency for the frequency of electromagnetism that needs to be suppressed.

Figure 3:
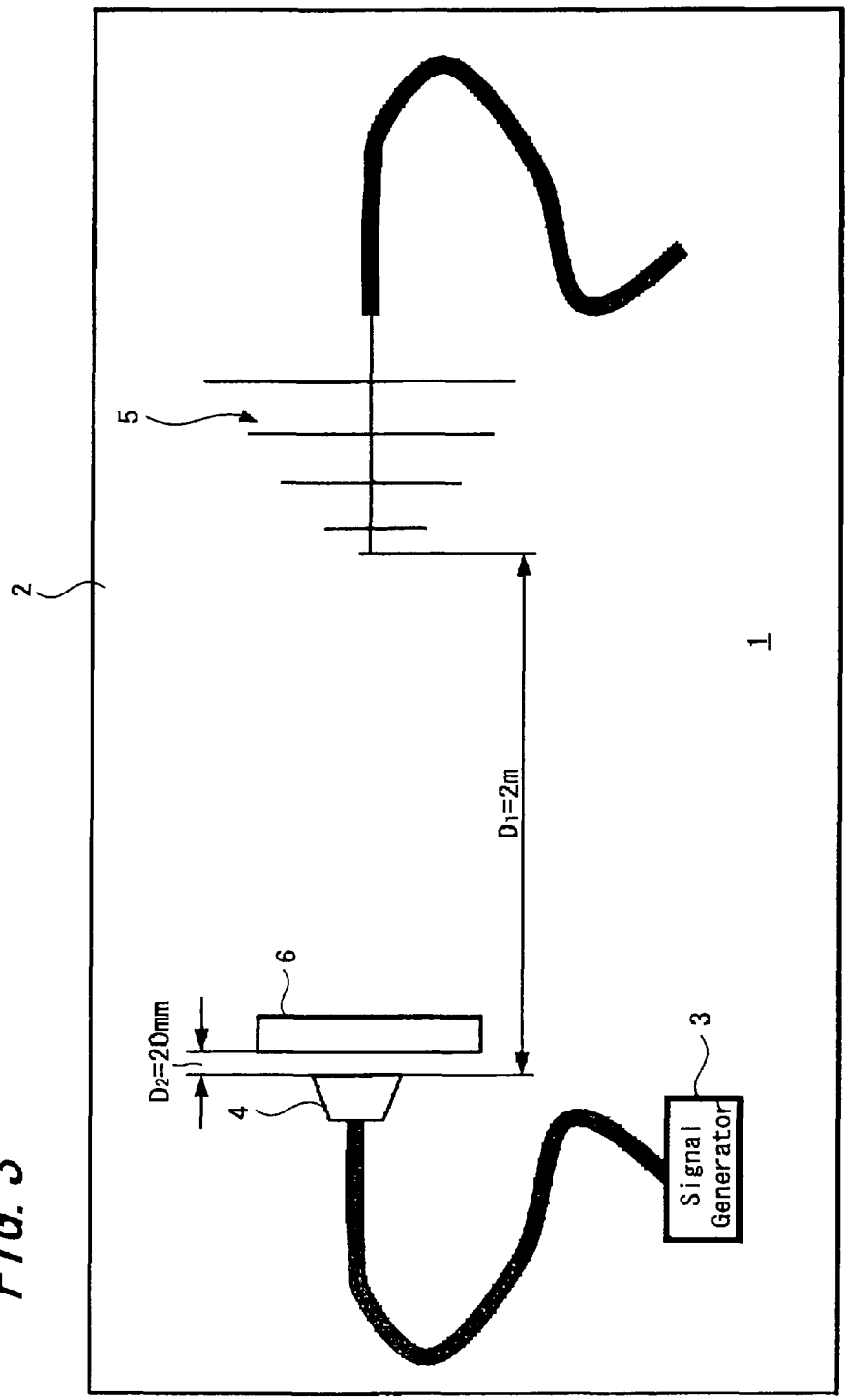
FIG. 3 is a diagram showing the construction used in the method of measuring in FIGS. 1A to 1E.

FIG. 3 shows the method of measuring. Symbol 1 is a measurement system for this method of measuring. An electromagnetic wave generating source 4 exposed to a signal from a signal generator 3 is provided in an anechoic chamber 2, and an electromagnetism reception antenna 5 is set up at a position opposite the electromagnetic wave generating source 4 in the emission direction. The distance D1 between the electromagnetic wave generating source 4 and the electromagnetism reception antenna 5 is around 2 m. Respective samples 6 (the magnetic sheets A and B and the gel materials a, b, c) that are around twice the size and four times the area of the electromagnetic wave generating source 4 are disposed so that the distance D2 from the electromagnetic wave generating source 4 is 20 mm. In these measurements, the electromagnetism suppressing effect was evaluated from changes in the amount of electromagnetism observed at the electromagnetism reception antenna 5 between the case where the respective samples were disposed and the case where no sample was disposed.

FIGS. 1A to 1E show the measurement results. FIGS. 1A to 1E are graphs showing the electromagnetism levels for respective frequencies when the electromagnetism is measured using the method of measuring in FIG. 3 on the electromagnetism suppressing materials a, b, and c according to the present embodiment and the magnetic sheets A and B. The thin lines show the results obtained when there was no sample, while the thick lines show the results obtained when measurement was carried out after the respective samples were disposed. The vertical axis represents the level of electromagnetism (dBm), while the horizontal axis represents the frequency (MHz). Measurements were carried out for frequencies of 300 MHz to 2000 MHz on the horizontal axis. In particular, FIG. 1D and FIG. 1E are graphs where magnetic sheets that are conventional, commercially available products were used for comparison purposes.

FIG. 1A is a graph where the gel material a that is an electromagnetism suppressing material according to the present embodiment is compared with the case where no sample is used. FIG. 1B is a graph where the gel material b that is an electromagnetism suppressing material according to the present embodiment is compared with the case where no sample is used. FIG. 1C is a graph where the gel material c that is an electromagnetism suppressing material according to the present embodiment is compared with the case where no sample is used. FIG. 1D is a graph where the conventional magnetic sheet A is compared with the case where no sample is used. This magnetic sheet A is sold for the MHz band. FIG. 1E is a graph where the conventional magnetic sheet B is compared with the case where no sample is used. This magnetic sheet B is sold for the GHz band.

FIGS. 2A to 2E are graphs showing an increase/decrease in electromagnetism produced by respectively subtracting the results for the respective samples of FIGS. 1A to 1E from the results for when there was no sample. That is, FIGS. 2A to 2E show the increase or decrease in electromagnetism at different frequencies due to the respective samples, such increase or decrease being calculated with the case where there is no sample in FIGS. 1A to 1E as a reference. The vertical axis represents the difference in electromagnetism (dBm), while the horizontal axis represents the frequency (MHz). The frequencies on the horizontal axis have a range of 300 MHz to 2000 MHz.

FIG. 2A is a graph for the gel material a. With the gel material a of the present embodiment, the average difference in electromagnetism was −0.99 (dBm).

FIG. 2B is a graph for the gel material b. With the gel material b of the present embodiment, the average difference in electromagnetism was −2.49 (dBm).

FIG. 2C is a graph for the gel material c. With the gel material c of the present embodiment, the average difference in electromagnetism was 1.19 (dBm).

FIG. 2D is a graph for the conventional magnetic sheet A. With the conventional magnetic sheet A, the average difference in electromagnetism was −0.61 (dBm).

FIG. 2E is a graph for the conventional magnetic sheet B. With the conventional magnetic sheet B, the average difference in electromagnetism was 1.68 (dBm).

According to the measurement results in FIGS. 1A to 1E and FIGS. 2A to 2E, the commercial electromagnetism suppressing sheet A has a greater electromagnetism suppressing effect than the electromagnetism suppressing sheet B, and in either case, an increase in electromagnetism was observed. In particular, when the electromagnetism suppressing sheet B has been set, a prominent increase in electromagnetism was observed for high frequency bands. The same results were obtained for the gel material c that is a mixture of acrylamide gel and water. It is believed that this is the result of there being little electromagnetic absorption and this being exceeded by an effect that focuses the electromagnetism. Electromagnetism is composed of an electric field and a magnetic field, and due to the characteristics of a material with a high dielectric constant and a material with a high magnetic permeability, an electric field and magnetic field in the periphery are focused. The effect is the same as the principle used by a magnetic shield.

On the other hand, a prominent attenuation of electromagnetism is observed for the gel materials a, b that are a mixture of acrylamide gel and salt solution. This means that the amount of electromagnetism absorbed by a gel material that is a mixture of gel and salt solution is large in the range of frequencies being measured, that is, the gel material has a high dielectric loss. The gel materials a, b therefore act as electromagnetism suppressing materials with a more favorable electromagnetism suppressing effect in the above frequency range than the commercial magnetic sheets.

Figures 4A, 4B:
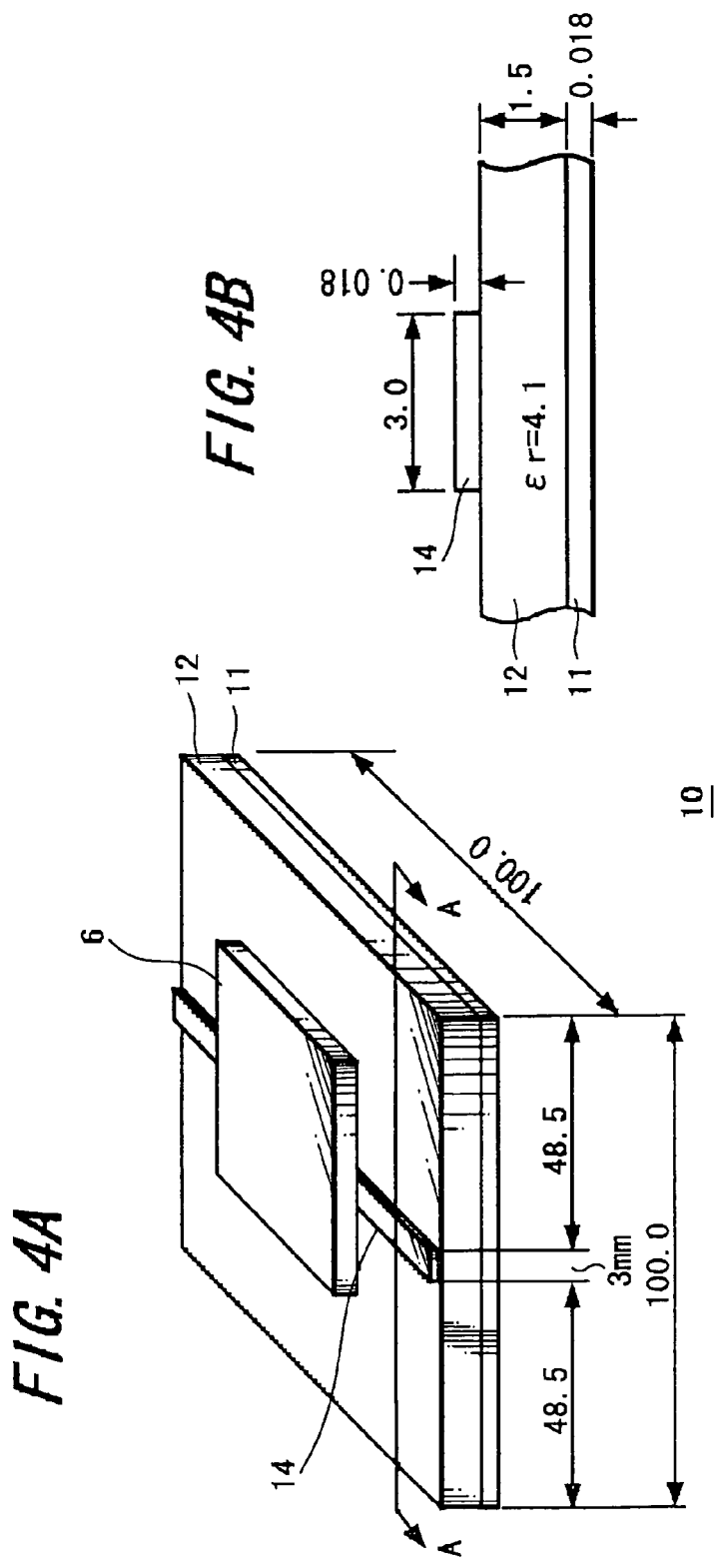
FIGS. 4A and 4B are diagrams showing the construction used for investigating a harmonic filter effect.

Next, a harmonic filter (shielding) effect was evaluated. The electromagnetism suppressing material according to the present invention used for measuring the effect is gel material b. The commercial magnetic sheet A was used as an existing material for comparison purposes. FIGS. 4A and 4B show the method of measuring the harmonic filter effect. Numeral 10 shows the entire measuring system for this method of measuring.

In FIG. 4, a microstrip line 14 is formed on a substrate 12 with a conductive layer 11 whose rear surface is at ground potential, with the sample 6 being mounted on the microstrip line 14. It should be noted that the height, width, and thickness of the substrate 12 are 100.0 mm, 100.0 mm, and 1.5 mm, respectfully, and the dielectric constant ∈r is 4.1. The thickness of the conductive layer 11 is 0.018 mm. The width and length of the microstrip line 14 are 3 mm and 100.0 mm, respectively.

By applying a signal to the microstrip line 14 from the input side to the output side, the reflection characteristics and the propagation characteristics were measured. The harmonic filter (shielding) effect was evaluated from the measurement results for the signal characteristics for when a sample was present and when no sample was present.

Figure 5A:
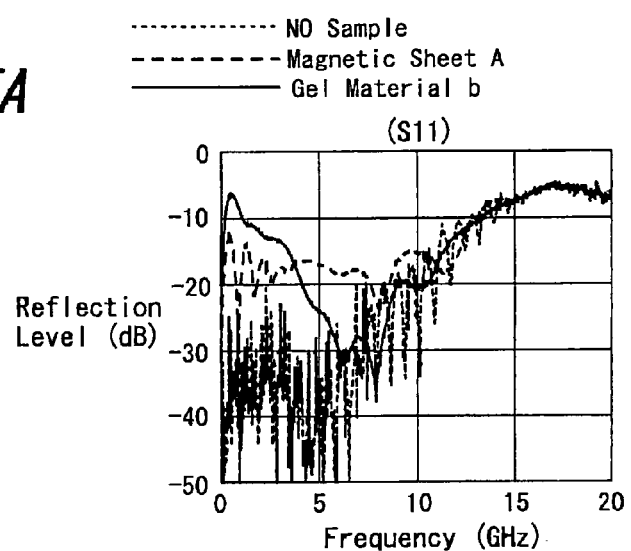
FIGS. 5A to 5C are respectively a graph showing reflectivity characteristics, a graph showing propagation characteristics, and a graph showing loss characteristics of electromagnetism suppressing materials according to an embodiment of the present invention.
Figure 5B:
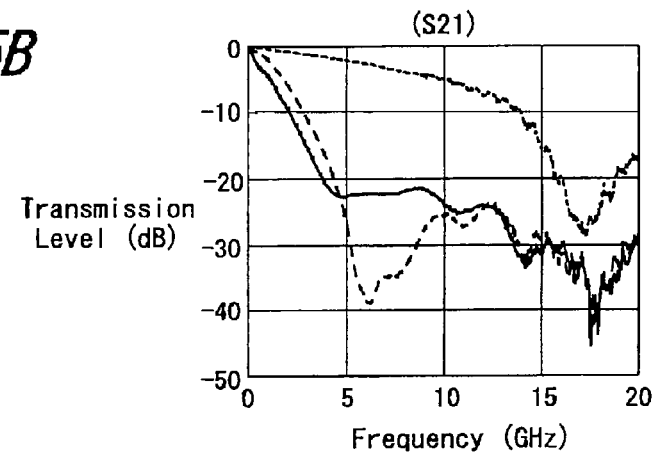
Figure 5C:
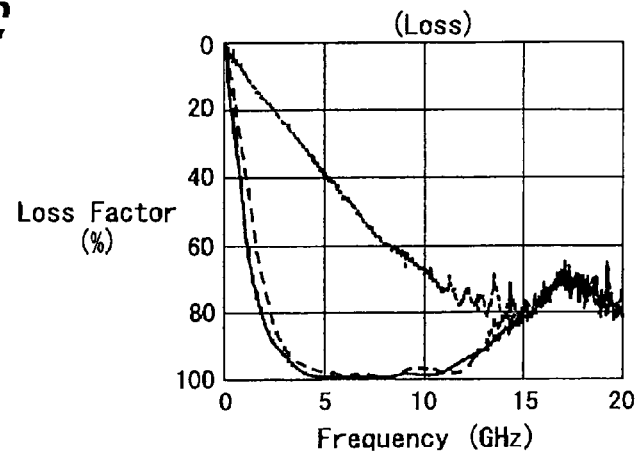
Figure 6A:
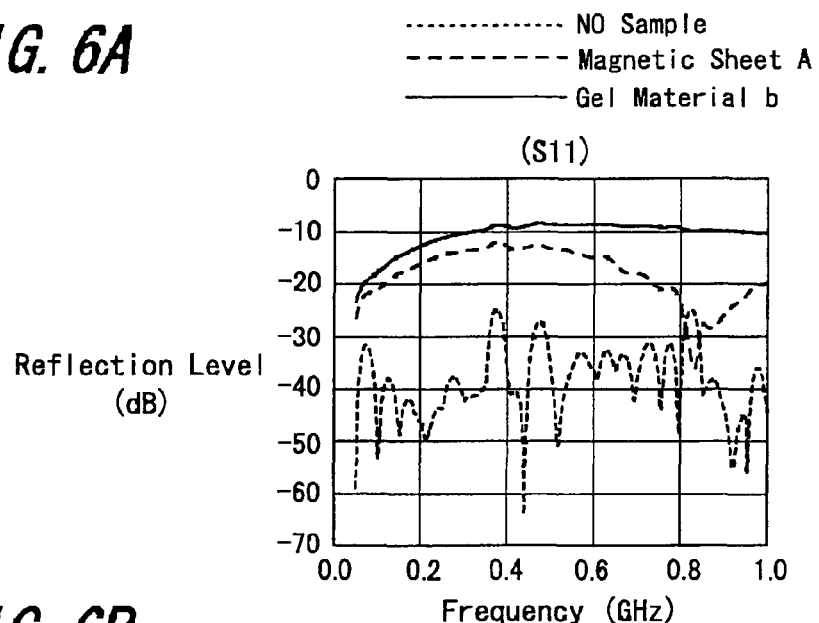
FIGS. 6A to 6C are respectively a graph showing a main part of FIG. 5A, a graph showing a main part of FIG. 5B, and a graph showing a main part of FIG. 5C.
Figure 6B:
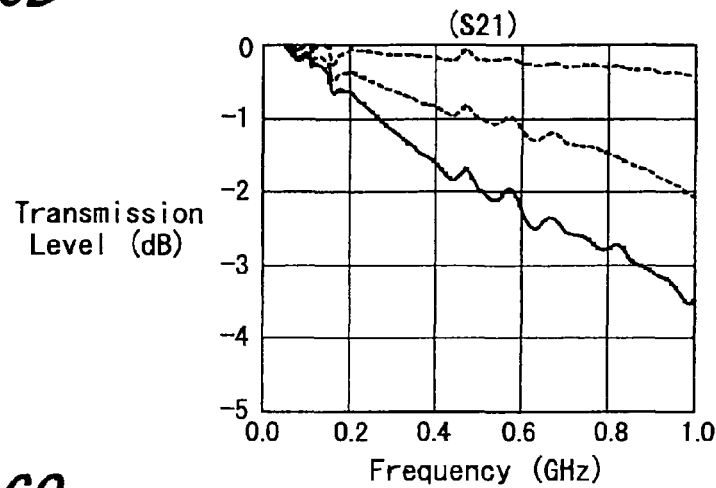
Figure 6C:
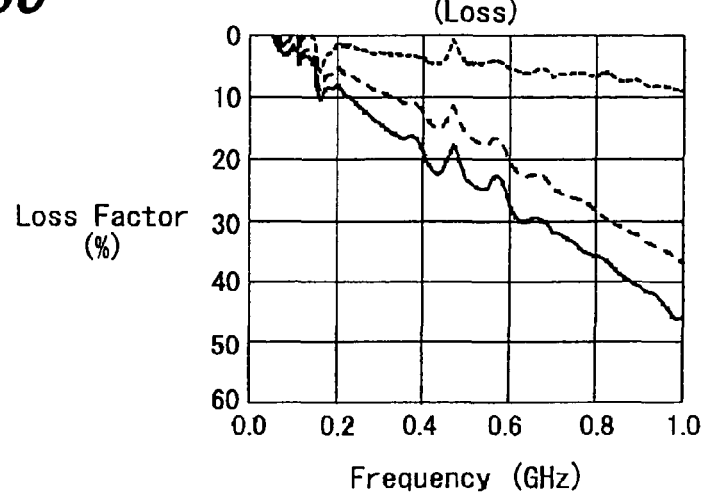

FIGS. 5A to 5C and FIGS. 6A to 6C are graphs where the harmonic filter effects were evaluated using the electromagnetism suppressing material according to the present embodiment. FIGS. 5A to 5C show the measurement results for frequencies of 0 to 20 GHz, and FIGS. 6A to 6C show the measurement results for the frequencies of 0 to 1 GHz that are the most important part of FIGS. 5A to 5C. The solid lines are for the gel material b that is one example of an electromagnetism suppressing material according to the present embodiment. The broken lines show the magnetic sheet A that is conventionally sold. The dotted lines show the case were there is no sample.

FIGS. 5A and 6A show the reflectivity characteristics (S11 characteristics) for reflection by the sample 6 when a signal is inputted into the input side of the microstrip line 14, with the vertical axis representing the reflectivity coefficient and the horizontal axis representing the frequency.

For example, for the frequencies 0 to 1 GHz, the reflectivity coefficient of the gel material b (solid line) of the present embodiment is −10 dB, which is slightly higher than the reflectivity coefficient of the conventional magnetic sheet (broken line) that is −10 dB to −30 dB. The reflectivity coefficient when there is no sample (dotted line) greatly rises and falls in a range of −20 dB to −60 dB. Here, a reflectivity coefficient of −30 dB refers to a case where in response to a signal (100%) inputted into the input side of the microstrip line 14, the reflectivity coefficient of the signal which is reflected to the input side due to unconformity between the impedances of the input port and the microstrip line model and unconformity in impedance due to the mounting of the sample 6 is 0.1%.

FIGS. 5B and 6B show the propagation characteristics (S21 characteristics) for transmission by the sample 6 when a signal is inputted into the input side of the microstrip line 14, with the vertical axis representing the propagated magnitude and the horizontal axis representing the frequency.

For example, for frequencies of 0 to 1 GHz, the propagated magnitude of the gel material b (solid line) according to the present embodiment exhibits a higher filter effect than the magnetic sheet (broken line) and when no sample is used (dotted line). In addition, even if the frequency is 5 GHz, the gel material b (solid line) of the present embodiment has a propagated magnitude of −20 dB, which is a higher filter effect than the propagated magnitude of the conventional magnetic sheet (broken line).

FIGS. 5C and 6C show the loss characteristics for absorption by the sample 6 when a signal is inputted into the input side of the microstrip line 14, with the vertical axis showing the loss factor and the horizontal axis showing the frequency.

For example, for frequencies of 0 to 1 GHz, the loss factor of the gel material b (solid line) according to the present embodiment is higher than that of the magnetic sheet (broken line) and when no sample is used (dotted line).

From the graphs in FIGS. 5A to 5C, it can be understood that regarding the propagation characteristics, the gel material b that is a mixture of acrylamide gel and salt solution has a propagated magnitude of −20 dB or below at frequencies of 5 GHz and above in the same way as the magnetic sheet A, which means that the gel material b has the same filter effect. The suppressing effect (loss effect) in FIG. 5C calculated from the reflectivity characteristics shown in FIG. 5A and the propagation characteristics shown in FIG. 5B are also substantially equal.

Since the standards for unnecessary radiation from an electronic appliance are presently for frequencies of 1 GHz or below, measurements were made for the frequency range of 0 to 1 GHz shown in FIGS. 6A to 6C. From the graphs in FIGS. 6A to 6C, it can be understood that although the gel material b that is a mixture of acrylamide gel and salt solution has slightly higher reflectivity compared to the magnetic sheet A in the measurement results of the reflectivity characteristics in FIG. 6A, the attenuation effect for harmonics is clearly larger in the measurement results of the propagation characteristics in FIG. 6B. The suppressing effect (loss effect) in FIG. 6C calculated from the reflectivity characteristics and the propagation characteristics is also clearly larger for the gel material b. From this, it can be understood that a more favorable effect can be obtained with the gel material b according to the present embodiment than with the commercial magnetic sheet.

From the above measurement results, the gel material according to the present embodiment is clearly superior at suppressing electromagnetism than the existing magnetic sheet. The gel material according to the present embodiment also has a lower cost, a low specific gravity, and superior flexibility compared to the existing magnetic sheet. In addition, the gel material can construct a device by being sealed (or packaged) in some kind of sealed member through which electromagnetism passes, such as a flexible sheet-like member such as a resin film, a flexible bag-like member, a hard case-like member, or a housing. There are no limitations on shape-related characteristics, and anything from a bulky shape to a sheet-like shape can be used, which is also superior to conventional materials.

Although gel materials produced by mixing acrylamide gel and salt solution and a gel material produced by mixing acrylamide gel and water were used in the above measurement tests, aside from these materials, even with a gel material produced by mixing a low-molecular-weight and/or polymeric material that has electrical polarity and/or can absorb and retain moisture, a molecular liquid material that has electrical polarity, and/or an ion electrolyte material, an electromagnetism suppressing effect that is equal to or greater than a conventionally available magnetic sheet can be obtained. In addition, with a molecular liquid material that has electrical polarity and/or an ion electrolyte material, an electromagnetism suppressing effect that is equal to or greater than a conventionally available magnetic sheet can be obtained. In such cases, also, the materials have the further advantages described above.

Next, another embodiment of an electromagnetism suppressing material according to the present invention produced by focusing in particular on materials with a large dielectric loss ($\in$") at frequencies of 1 GHz or below will be described.

The electromagnetism suppressing material according to this embodiment of the present invention is composed of a liquid electrolyte material or a gel material that includes the electrolyte. Representative examples of a liquid electrolyte material are the aqueous solutions of a compound of a group 1A element and a halogen element and the aqueous solutions of a compound of a group 2A element and a halogen element that were given above. Also, two or more types of such solutions may be used. That is, it is possible to use one type or two or more types of liquid materials selected from aqueous solutions of a compound of a group 1A element and a halogen element and aqueous solutions of a compound of a group 2A element and a halogen element. For example, as representative examples of the electrolyte, at least one type of liquid material selected from aqueous sodium chloride solution, aqueous sodium iodide solution, aqueous potassium chloride solution, aqueous potassium iodide solution, aqueous calcium chloride solution, and aqueous magnesium chloride solution can be used.

In addition, the electromagnetism suppressing material according to the other embodiment of the present invention is composed by mixing a low-molecular-weight and/or polymeric material that can absorb and retain moisture and at least one liquid material selected from an aqueous solution of a compound of a group 1A element and a halogen element and an aqueous solution of a compound of a group 2A element and a halogen element described above (as representative examples, aqueous sodium chloride solution, aqueous sodium iodide solution, aqueous potassium chloride solution, aqueous potassium iodide solution, aqueous calcium chloride solution, and aqueous magnesium chloride solution). As the low-molecular-weight and/or polymeric material that can absorb and retain moisture, it is preferable to use a chemically crosslinked gel material. Compared to physical crosslinking, chemical crosslinking can produce a gel state that can be stably maintained even at high temperature.

Acrylamides, such as 2-acrylamide-2 methyl propane acid, dimethyl acrylamide, acrylamide, acrylic acid, methyl acrylate, methylenebisacrylamide, and acrylamide polymer, can be used as the chemically crosslinked gel material. Also, as the chemically crosslinked gel material, it is possible to use at least one acrylamide material selected from the materials listed above.

As the method of chemically crosslinking the gel material, it is possible to use thermal crosslinking or UV crosslinking.

For the present embodiment, an electromagnetism suppressing device can be constructed by sealing at least one type of the electromagnetism suppressing material in a required sealed member. In addition, for the present embodiment, an electronic appliance can be constructed by mounting the electromagnetism suppressing material and/or electromagnetism suppressing device described above.

Figure 8:
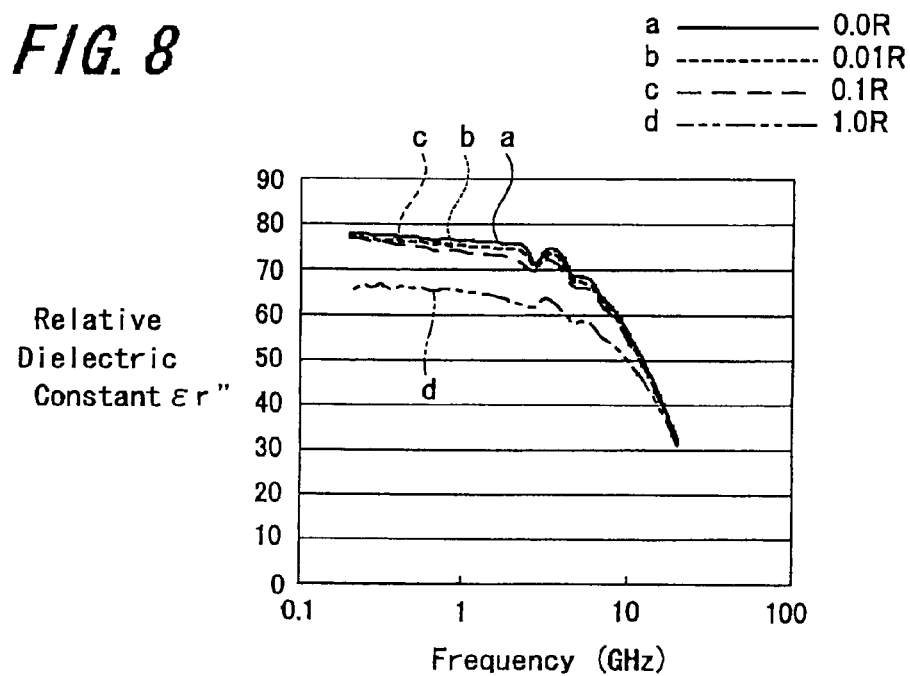
FIG. 8 is a graph showing the dielectric constant characteristics of a real part of the electromagnetism suppressing material according to another embodiment of the present invention.
Figure 9:
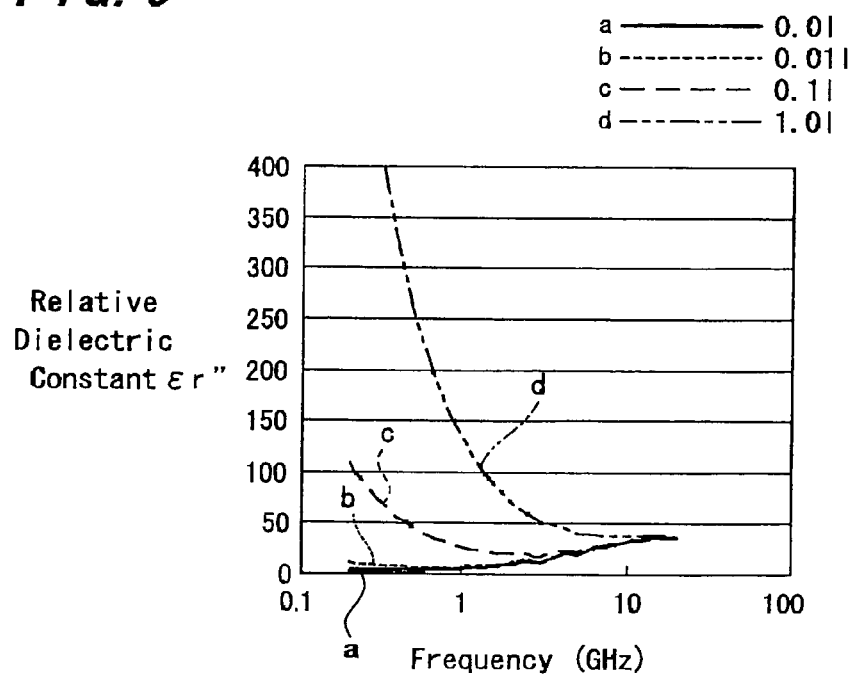
FIG. 9 is a graph showing the dielectric constant characteristics of an imaginary part of the electromagnetism suppressing material according to another embodiment of the present invention.

Next, the dielectric constant characteristics of the electromagnetism suppressing materials according to the embodiments described above, that is, an electromagnetism suppressing material that is a gel material fabricated using specific materials, are shown in FIGS. 8 and 9. FIGS. 8 and 9 show the dielectric constant characteristics of the electromagnetism suppressing material that is a gel in which methylenebisacrylamide is mixed into acrylamide as a crosslinking material and uses salt solution where sodium chloride has been dissolved as the solvent of an electrolyte.

In FIG. 8, the vertical axis represents the relative dielectric constant $\in$r', the horizontal axis represents the frequency, and the dielectric constant characteristics of a real part of a complex dielectric constant are shown with the salt concentration as a parameter.

In FIG. 9, the vertical axis represents the relative dielectric constant $\in$r", the horizontal axis represents the frequency, and the dielectric constant characteristics of an imaginary part are shown with the salt concentration as a parameter.

In FIGS. 8 and 9, the curve a shows the case where the salt concentration was set at 0.0 mol/l. The curve b shows the case where the salt concentration was set at 0.01 mol/l. The curve c shows the case where the salt concentration was set at 0.1 mol/l. The curve d shows the case where the salt concentration was set at 1.0 mol/l. It should be noted that the symbol "R" at the end of a parameter shows that the parameter is for the real part while the symbol "I" shows that the parameter is for the imaginary part.

It can be understood that the relative dielectric constant (real part) $\in r'$ tends to fall, if slightly, as the salt concentration increases. Conversely, as the salt concentration increases, the relative dielectric constant (imaginary part) $\in r''$ greatly increases. From Equation 1 given above, as the value of $\in r''$ increases, the electromagnetism suppressing/absorbing characteristics improve. By comparing the illustrated results to the loss part $\mu r''$ of the relative dielectric constant of a magnetic sheet which is around 10 at 1 GHz or thereabouts, it can be understood that when the salt concentration is 0.1 mol or greater for the electromagnetism suppressing material according to the present embodiment, electromagnetic absorption is much greater than with the magnetic sheet.

By focusing on a material with a high dielectric constant $\in''$ in Equation 1 described above, the electromagnetism suppressing material according to the present embodiment can suppress and absorb electromagnetism for frequencies of the MHz band and GHz band. The electromagnetism suppressing effect of a representative electromagnetism suppressing material according to the present embodiment was tested.

The method of measuring used to test the present embodiment is the same as that described using FIG. 3 and FIGS. 4A and 4B. A gel produced from a liquid material of sodium chloride (1.0 mol/l) was used as a measurement sample (an electromagnetism suppressing material according to the present embodiment). Acrylamide: 1 mol/l and methylenebisacrylamide: 0.5 mol %/l, and ammonium peroxide: 0.2 mol %/l as a thermal crosslinking initiator, were mixed to fabricate a gel at 70° C. in a sheet-like state.

Figure 10:
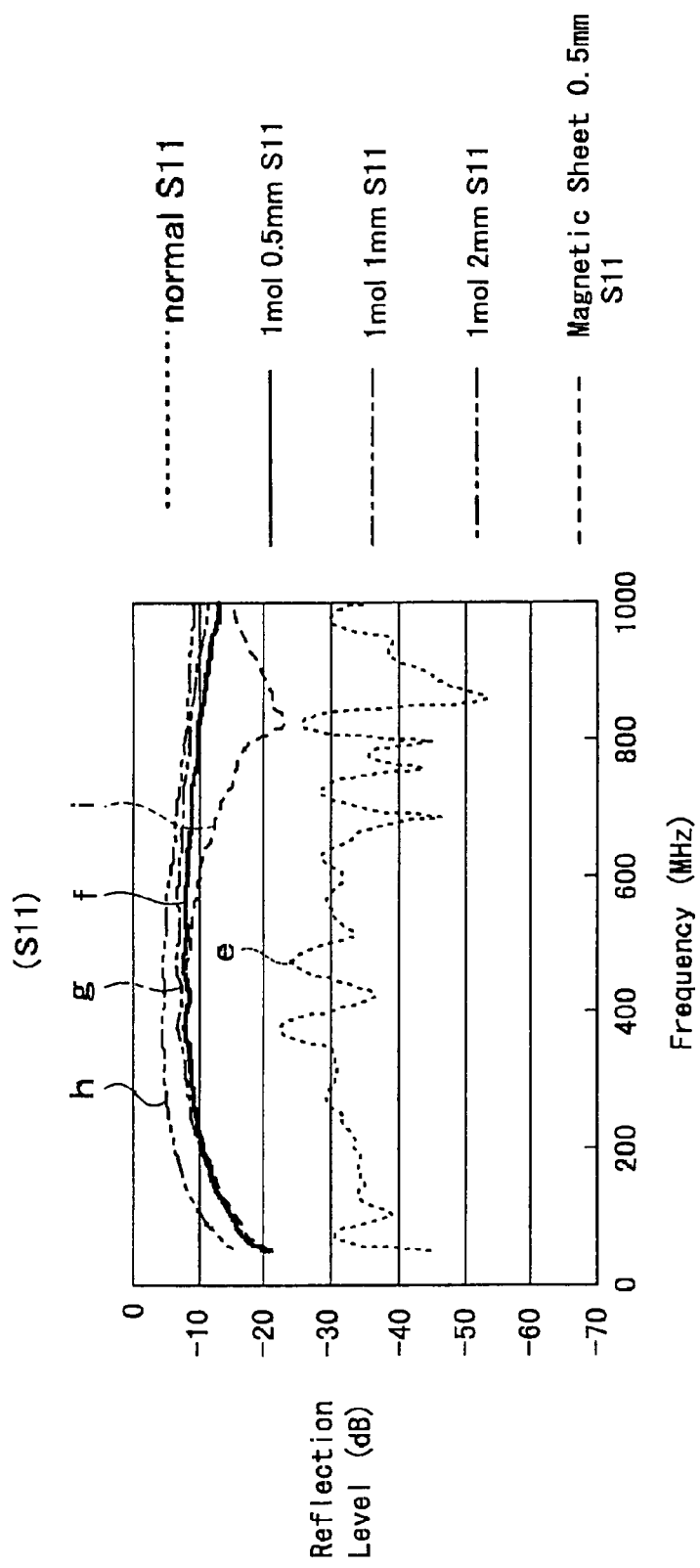
FIG. 10 is a graph showing the reflectivity characteristics of an electromagnetism suppressing material according to another embodiment of the present invention.
Figure 11:
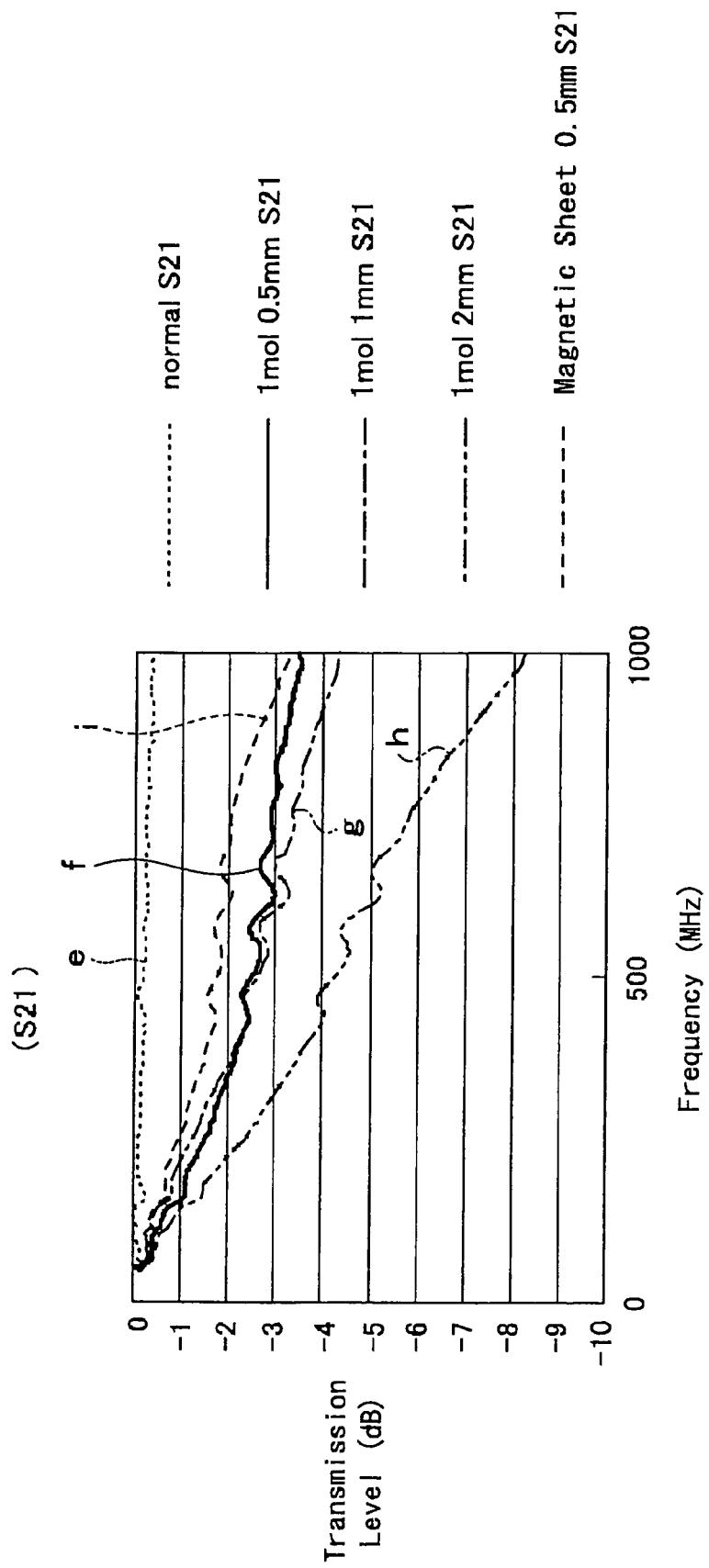
FIG. 11 is a graph showing the propagation characteristics of an electromagnetism suppressing material according to another embodiment of the present invention.

FIGS. 10 and 11 are graphs in which the harmonic filter effect is evaluated using the electromagnetism suppressing material (the measurement sample described above) according to the present invention. The measurement results are shown for frequencies from 50 to 1000 MHz. The curve e shows the measurement results for the state where there is no sample, the curve f shows the results for a material according to the present invention that is 0.5 mm thick, the curve g shows the results for a material according to the present invention that is 1 mm thick, the curve h shows the results for a material according to the present invention that is 2 mm thick, and the curve i shows the results for a commercial magnetic sheet as the electromagnetism suppressing material.

FIG. 10 shows the reflectivity characteristics (S11 characteristics) for reflection by the sample when a signal is inputted into the input side of a microstrip line, with the vertical axis representing the reflectivity coefficient and the horizontal axis representing the frequency. From FIG. 10, the reflectivity coefficient of the gel material of the present embodiment is around −10 dB, and at frequencies of 600 MHz or below, the gel material has the same characteristics as the reflectivity coefficient of the conventional magnetic sheet (curve i). The reflectivity coefficient when there is no sample (curve e) greatly rises and falls in a range of −30 dB to −40 dB. Here, a reflectivity coefficient of −30 dB refers to a case where in response to a signal (100%) inputted into the input side of the microstrip line, the reflectivity coefficient of the signal which is reflected to the input side due to unconformity between the impedances of the input port of the microstrip line and the microstrip line model and unconformity in impedance due to the mounting of the sample is 0.1%.

FIG. 11 shows the propagation characteristics (S21 characteristics) for propagation by the sample when a signal is inputted into the input side of the microstrip line 14, with the vertical axis representing the propagated magnitude and the horizontal axis representing the frequency. From FIG. 11, the propagated magnitude of the gel materials of the present embodiment (curves f, g, h) exhibits higher filter characteristics than the magnetic sheet (curve i).

Figure 12:
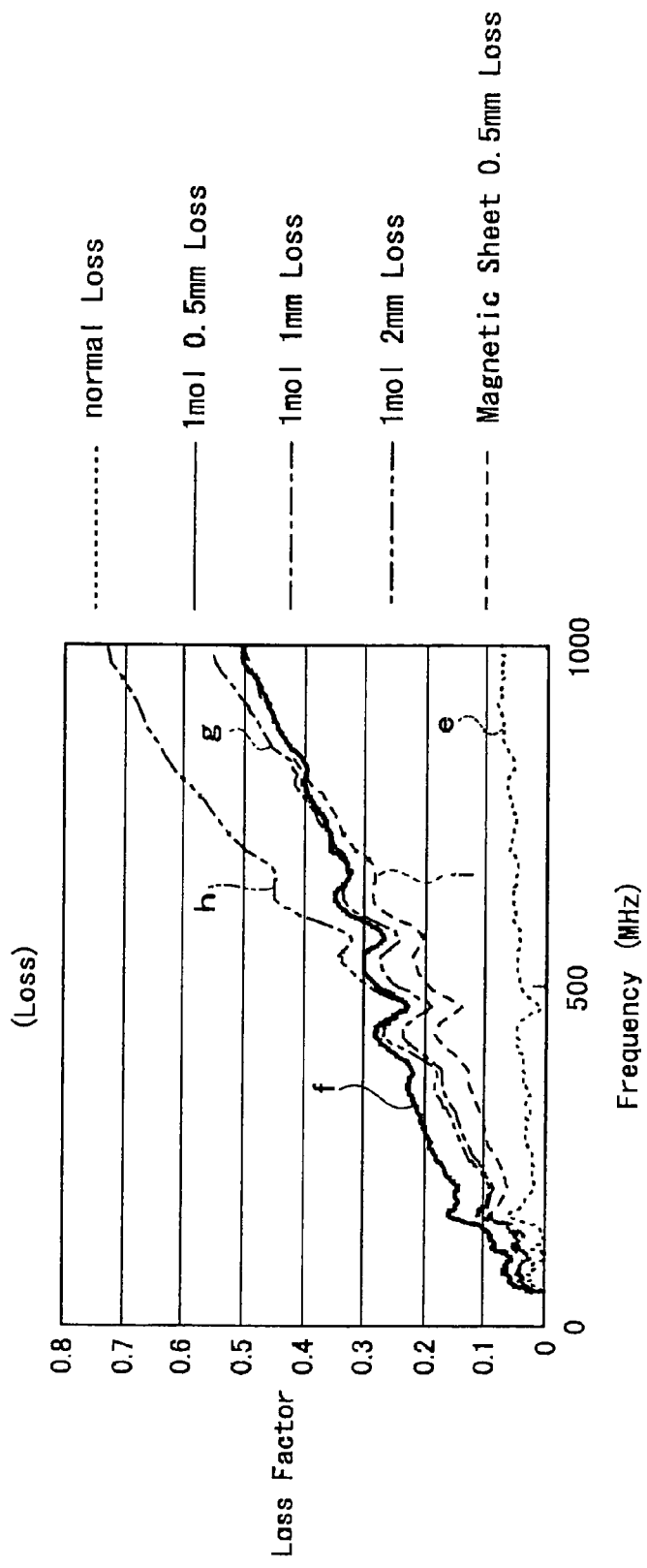
FIG. 12 is a graph showing the loss characteristics of an electromagnetism suppressing material according to another embodiment of the present invention.

FIG. 12 shows the loss characteristics for absorption by the sample when a signal is inputted into the input side of the microstrip line, with the vertical axis representing the loss factor and the horizontal axis representing the frequency. That is, the loss factor is the value produced by subtracting the reflectivity coefficient and the propagated magnitude from the input amount. Here, the larger the loss factor, the greater the electromagnetism suppressing/absorbing effect. It should be noted that in FIG. 12, the curve e shows the state where there is no sample, the curve f shows a material according to the present invention that is 0.5 mm thick, the curve g shows a material according to the present invention that is 1 mm thick, the curve h shows a material according to the present invention that is 2 mm thick, and the curve i shows a commercial magnetic sheet as the electromagnetism suppressing material. From FIG. 12, it can be seen that the loss factor of the gel material according to the present embodiment is higher than the magnetic sheet for the same thickness. It can also be understood that the greater the sheet thickness, the higher the loss factor.

In the embodiments described above, for an electromagnetism suppressing material fabricated using: at least one liquid material selected from aqueous solutions of a compound of a group 1A element and a halogen element and aqueous solutions of a compound of a group 2A element and a halogen element (as representative examples, aqueous sodium chloride solution, aqueous sodium iodide solution, aqueous potassium chloride solution and aqueous potassium iodide solution); and at least one material selected from 2-acrylamide-2 methyl propane acid, dimethyl acrylamide, acrylamide, acrylic acid, methyl acrylate, methylenebisacrylamide, and acrylamide polymer as a chemically crosslinked gel material, the reflectivity characteristics (S11 characteristics), the propagation characteristics (S21 characteristics), and the loss characteristics have the same tendencies as the measurement samples of the present embodiment described above.

The electromagnetism suppressing material according to the present invention is not limited to the measurement samples described above. The electromagnetism suppressing material can be fabricated with an electrolyte, a polymer for producing a gel, a chemically crosslinked material, and an initiator.

From the measurement results described above, it is clear that the gel material according to the present embodiment is superior to the existing magnetic sheet at suppressing electromagnetism in the same way as described above, especially at suppressing electromagnetism in the band of 1 GHz or below. Compared to the existing magnetic sheet, the gel material according to the present embodiment has a low cost, a low specific gravity, and superior flexibility. In addition, the gel material can be used to construct a device by being sealed (or packaged) in some kind of sealed member through which electromagnetism passes, such as a flexible sheet-like body such as a resin film, a flexible bag-like body, a hard case-like body, or a housing. There are no limitations on shape-related characteristics, and anything from a bulky shape to a sheet-like shape can be used, which is also superior to conventional materials.

In addition, the electromagnetism suppressing material and/or electromagnetism suppressing device according to the present embodiment can be mounted in an electronic appliance as described above.

By using the electromagnetism suppressing material according to the various embodiments of the present embodiment, it is possible to achieve a higher electromagnetism suppressing effect than an existing magnetic material. By focusing on materials that have a favorable dielectric loss in addition to suppressing and absorbing electromagnetism, and also utilizing changes in the dielectric loss due to the state of the material, which in the present embodiments is a liquid or gel state, it is possible to suppress and absorb electromagnetism in a predetermined frequency band.

In addition, when an electromagnetism suppressing material is composed of a gel material, it is possible to use the material between substrates or between a substrate and a housing, and therefore it is possible to use the material as a new electromagnetism suppressing material and an electromagnetism suppressing device that function as both an electromagnetism suppressing absorbing material and a shock absorbing material. When the electromagnetism suppressing material is composed of a chemically crosslinked gel material, it is possible to maintain a stable state even when the temperature of the apparatus changes, thereby improving reliability.

With the electromagnetism suppressing device according to the present invention, the electromagnetism suppressing material can be sealed in a variety of forms, which makes it possible to suppress electromagnetism more optimally. When produced in a sheet-like form, the electromagnetism suppressing material according to the present invention is superior to existing magnetic sheets. Also, compared to existing magnetic sheets, the electromagnetism suppressing material has a low cost, a low specific gravity, and superior flexibility, in addition to being superior in that there are no limitations on shape-related characteristics, and anything from a bulky shape to a sheet-like shape can be used. The electromagnetism suppressing material according to the present invention does not need to be sealed in a resin film as in the above embodiment, and by providing a cavity in a housing or the like into which the electromagnetism suppressing material can be injected, it is possible to have part or all of the housing suppress electromagnetism by injecting the electromagnetism suppressing material. The sealed member may be a material aside from a metal material that reflects electromagnetism.

In an electronic appliance according to the present invention, the electromagnetism suppressing material or an electromagnetism suppressing device in which the electromagnetism suppressing material is sealed in a sealed member is stuck onto a substrate, a flexible cable, or a semiconductor component within the electronic appliance, thereby suppressing electromagnetism in the electronic appliance.

According to an electronic appliance according to the present invention, by using the electromagnetism suppressing material or an electromagnetism suppressing device in which the electromagnetism suppressing material is sealed in a sealed member, it is possible to suppress unnecessary electromagnetism and therefore prevent malfunctioning of the electronic appliance.

It should be understood by those skilled in the art that various modifications, combinations, sub-combinations and alterations may occur depending on design requirements and other factors insofar as they are within the scope of the appended claims or the equivalents thereof.

What is claimed is:

1. An electromagnetism suppressing material comprising:
   A mixture of a magnetic powder and a material, said magnetic powder being from the group consisting of Mn—Zn ferrite, Cu—Zn ferrite and Ni—Zn ferrite,
   wherein said material is a first material or a second material:
   said first material being a low-molecular-weight and/or polymeric material with electrical polarity that has been caused to swell with an electrolyte, optionally further comprising additional electrolyte; and
   said second material being a mixture of a low-molecular-weight and/or polymeric material that can absorb and retain moisture and said electrolyte.

2. An electromagnetism suppressing material according to claim 1, wherein said material is said first material.

3. An electromagnetism suppressing material according to claim 1, wherein said material is said second material.

4. An electromagnetism suppressing material according to claim 1, wherein said magnetic powder is Mn—Zn ferrite.

5. An electromagnetism suppressing material according to claim 1, wherein said magnetic powder is Cu—Zn ferrite.

6. An electromagnetism suppressing material according to claim 1, wherein said magnetic powder is Ni—Zn ferrite.

7. An electromagnetism suppressing material according to claim 1, wherein said material has an electrical polarity.

8. An electromagnetism suppressing material according to claim 1, wherein said electrolyte is an aqueous sodium chloride solution.

9. An electromagnetism suppressing material according to claim 1, wherein said electrolyte is an aqueous sodium iodide solution.

10. An electromagnetism suppressing material according to claim 1, wherein said electrolyte is an aqueous potassium chloride solution.

11. An electromagnetism suppressing material according to claim 1, wherein said electrolyte is an aqueous potassium iodide solution.

12. An electromagnetism suppressing material according to claim 1, wherein said electrolyte is an aqueous calcium chloride solution.

13. An electromagnetism suppressing material according to claim 1, wherein said electrolyte is aqueous magnesium chloride solution.

14. An electromagnetism suppressing material according to claim 1, wherein said electrolyte is an aqueous sodium hydroxide solution.

15. An electromagnetism suppressing material according to claim 1, wherein said electrolyte is an aqueous hydrochloric acid solution.

16. An electromagnetism suppressing material according to claim 1, wherein said electrolyte is an aqueous ammonium chloride solution.

17. An electromagnetism suppressing material according to claim 1, wherein said electrolyte is an aqueous zinc chloride solution.

18. An electromagnetism suppressing material according to claim 1, wherein said low-molecular-weight and/or polymeric material with electrical polarity is from the group consisting of polyacrylamides and ethylene glycols.

19. An electromagnetism suppressing material according to claim 1, wherein said low-molecular-weight and/or polymeric material that can absorb and retain moisture is from the group consisting of polyacrylamides and ethylene glycols.

20. An electromagnetic suppressing article comprising the electromagnetic suppressing material according to claim 1, wherein said material is sealed within a sealed member.

* * * * *